US010254602B2

(12) United States Patent
Cao et al.

(10) Patent No.: US 10,254,602 B2
(45) Date of Patent: Apr. 9, 2019

(54) ARRAY SUBSTRATE MOTHERBOARD, DISPLAY PANEL MOTHERBOARD, AND FABRICATING METHOD THEREOF

(71) Applicants: BOE TECHNOLOGY GROUP CO., LTD, Beijing (CN); BEIJING BOE DISPLAY TECHNOLOGY CO., LTD., Beijing (CN)

(72) Inventors: Jinhu Cao, Beijing (CN); Minghui Ma, Beijing (CN); Jiaxin Yu, Beijing (CN); Fengwu Yu, Beijing (CN); Bin Cao, Beijing (CN); Namin Kwon, Beijing (CN); Wei Li, Beijing (CN); Zhi Li, Beijing (CN); Xinlei Cao, Beijing (CN); Enke Guo, Beijing (CN)

(73) Assignees: BOE TECHNOLOGY GROUP CO., LTD, Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 25 days.

(21) Appl. No.: 15/519,648

(22) PCT Filed: Nov. 7, 2016

(86) PCT No.: PCT/CN2016/104896
§ 371 (c)(1),
(2) Date: Apr. 17, 2017

(87) PCT Pub. No.: WO2017/161893
PCT Pub. Date: Sep. 28, 2017

(65) Prior Publication Data
US 2018/0095313 A1    Apr. 5, 2018

(30) Foreign Application Priority Data
Mar. 22, 2016    (CN) .......................... 2016 1 0165999

(51) Int. Cl.
*G02F 1/1345*    (2006.01)
*H01L 27/12*    (2006.01)
(Continued)

(52) U.S. Cl.
CPC .......... *G02F 1/1345* (2013.01); *G09G 3/006* (2013.01); *G09G 3/3688* (2013.01); *H01L 27/12* (2013.01);
(Continued)

(58) Field of Classification Search
CPC ..................................................... G02F 1/1345
See application file for complete search history.

(56) References Cited

U.S. PATENT DOCUMENTS

2003/0085855 A1    5/2003    Tomita
2006/0267971 A1*   11/2006   Yoo ......................... C25D 5/02
                                                              345/206
(Continued)

FOREIGN PATENT DOCUMENTS

CN    101315508 A    12/2008
CN    101950109 A    1/2011
(Continued)

OTHER PUBLICATIONS

The World Intellectual Property Organization (WIPO) International Search Report and Written Opinion for PCT/CN2016/104896 dated Jan. 25, 2017 12 Pages.

*Primary Examiner* — Edmond C Lau
(74) *Attorney, Agent, or Firm* — Anova Law Group, PLLC

(57) ABSTRACT

In some embodiments, an array substrate motherboard and a fabricating method thereof are provided. The method includes: providing a substrate including multiple gate lines, gate driving leads, data lines, and data driving leads, each gate line corresponds to one gate driving lead, each data line
(Continued)

corresponds to one data driving lead; forming multiple gate line testing leads, each gate line testing lead is connected with a gate driving lead; forming multiple data line testing leads, each data line testing lead is connected with a subset of the multiple data driving leads; forming multiple gate line testing pads, each gate line testing pad is connected with a gate line testing lead; forming multiple data line testing pads, each data line testing pad is connected with two data line testing leads; and using the gate line testing pads and gate line testing pads to test the gate lines and data lines.

18 Claims, 3 Drawing Sheets

(51) Int. Cl.
  *G09G 3/00* (2006.01)
  *G09G 3/36* (2006.01)
  *G02F 1/1362* (2006.01)
(52) U.S. Cl.
  CPC ............ *G02F 2001/136254* (2013.01); *G02F 2001/136272* (2013.01); *G09G 3/3648* (2013.01); *G09G 2300/0413* (2013.01)

(56) References Cited

U.S. PATENT DOCUMENTS

| | | | | |
|---|---|---|---|---|
| 2007/0018680 A1* | 1/2007 | Jeon | ........................ | G09G 3/006 324/750.3 |
| 2011/0096449 A1* | 4/2011 | Lee | ........................ | G02F 1/1345 361/91.1 |
| 2012/0161805 A1* | 6/2012 | Jung | ........................ | G09G 3/006 324/754.07 |
| 2012/0287357 A1* | 11/2012 | Misaki | ................ | G02F 1/13338 349/12 |
| 2015/0084666 A1* | 3/2015 | Kim | ........................ | G09G 3/006 324/762.03 |
| 2016/0328062 A1* | 11/2016 | Jin | ........................ | G06F 3/0412 |

FOREIGN PATENT DOCUMENTS

| | | |
|---|---|---|
| CN | 102331633 A | 1/2012 |
| CN | 105096780 A | 11/2015 |
| CN | 105607316 A | 5/2016 |
| JP | 2004325956 A | 11/2004 |
| KR | 20020094636 A | 12/2002 |

\* cited by examiner

ARRAY SUBSTRATE MOTHERBOARD, DISPLAY PANEL MOTHERBOARD, AND FABRICATING METHOD THEREOF

CROSS-REFERENCES TO RELATED APPLICATIONS

This application is a national phase entry under 35 U.S.C. § 371 of International Application No. PCT/CN2016/104896, filed on Nov. 7, 2016, which claims priority to Chinese Patent Application No. 201610165999.4, filed on Mar. 22, 2016. The above enumerated patent applications are incorporated by reference herein in their entirety.

TECHNICAL FIELD

The disclosed subject matter generally relates to display technologies and, more particularly, relates to an array substrate motherboard, a fabricating method thereof, and a related display panel motherboard.

BACKGROUND

To test the liquid crystal cell of the thin film transistor-liquid crystal display (TFT-LCD), a block pin contact mode can be used to load signals to the lead regions of the panel pad. Multiple block pins can correspond to multiple lead regions of the panel pad respectively. Testing electrodes contacting with the block pins can be connected to the gate lines on the array substrate through testing lines, so that the testing electrodes can send testing signals to the gate lines. Since the gate lines and the testing lines are usually connected through bridge circuits, the electro-static discharge phenomenon may occur at the contacting via holes of the bridge circuits. Therefore, the gate lines may be broken down, result in an abnormal lighting.

Accordingly, it is desirable to provide an array substrate motherboard, a fabricating method thereof, and a related display panel motherboard to at least partially alleviate one or more problems set forth above and to solve other problems in the art.

BRIEF SUMMARY

In accordance with some embodiments of the disclosed subject matter, an array substrate motherboard, a fabricating method thereof, and a related display panel motherboard are provided.

One aspect of the present disclosure provides a method for fabricating an array substrate motherboard. The method for fabricating an array substrate motherboard can include: providing a substrate including a plurality of gate lines, gate driving leads, data lines, and data driving leads, wherein each gate line corresponds to one gate driving lead, and each data line corresponds to one data driving lead; forming a plurality of gate line testing leads, wherein each gate line testing lead is connected with a corresponding gate driving lead; forming a plurality of data line testing leads, wherein each data line testing lead is connected with a corresponding subset of the plurality of data driving leads; forming a plurality of gate line testing pads, wherein each gate line testing pad is connected with a corresponding gate line testing lead; forming a plurality of data line testing pads, wherein each data line testing pad is connected with two corresponding data line testing leads; and using the plurality of gate line testing pads and the plurality of gate line testing pads to test the plurality of gate lines and the plurality of data lines.

In some embodiments, a width of each gate line testing pad is larger than a width of each gate line testing lead; and a width of the data line testing pad is larger than a width of the data line testing lead.

In some embodiments, the method further comprises: forming at least one dummy gate line testing pad that is temperately disconnected with the gate line testing leads.

In some embodiments, a total number of the gate line testing pads and dummy gate line testing pads is equal to or larger than 20.

In some embodiments, the gate line testing pads and the dummy gate line testing pads are arranged along a straight line on one side of the gate line driving leads; and the gate line testing pads and the dummy gate line testing pads are equally spaced.

In some embodiments, the gate line testing pads, the at least one dummy gate line testing pad, the gate line testing leads, and the gate line driving leads are made of a same material, and are in a same layer.

In some embodiments, the method further comprises: forming at least one dummy data line testing pad that is temperately disconnected with the data line testing leads.

In some embodiments, the method further comprises: forming at least one common testing pad to connect at least one adjacent common electrode driving lead.

In some embodiments, a total number of the data line testing pads, the at least one dummy data line testing pad, and the at least one common testing pad is equal to or larger than 20.

In some embodiments, the method further comprises: the data line testing pads, the at least one dummy data line testing pad, and the at least one common testing pad are arranged along a straight line on one side of the data line driving leads; and the data line testing pads, the at least one dummy data line testing pad, and the at least one common testing pad are equally spaced.

In some embodiments, the method further comprises: forming an insulating layer between the data line testing pads and the data line driving leads; wherein each data line driving lead is connected with two data line testing leads that penetrate through the insulating layer through two via-holes respectively, and the two data line testing leads are connected to a same data line testing pad.

In some embodiments, a number of the data line testing pads is two; a first data line testing pad is interconnected with all odd number data line driving leads through two data line testing leads; and a second data line testing pad is interconnected with all odd number data line driving leads through two data line testing leads.

In some embodiments, a number of the data line testing pads is six; a first data line testing pad is interconnected with a subset of data line driving leads carrying a R1 signal through two data line testing leads; a second data line testing pad is interconnected with a subset of data line driving leads carrying a G1 signal through two data line testing leads; a third data line testing pad is interconnected with a subset of data line driving leads carrying a B1 signal through two data line testing leads; a fourth data line testing pad is interconnected with a subset of data line driving leads carrying a R2 signal through two data line testing leads; a fifth data line testing pad is interconnected with a subset of data line driving leads carrying a G2 signal through two data line testing leads; and a sixth data line testing pad is interconnected with a subset of data line driving leads carrying a B2 signal through two data line testing leads.

In some embodiments, the method further comprises: forming at least a pair of laser alignment marks to align a laser in a trimming region of the substrate, wherein the trimming region of the substrate includes a portion of the gate line testing leads and the data line testing leads; and after testing the gate lines and the of data lines, emitting a laser in the trimming region to trim the portion of the gate line testing leads and the data line testing leads.

In some embodiments, the method further comprises: forming a plurality of gate line testing extension lines bypasses the trimming region, wherein one end of each the gate line testing extension lines is connected to a corresponding gate line testing pad, another end of each gate line testing extension lines is extended towards an edge of the substrate.

Another aspect of the present disclosure provides an array substrate motherboard. The array substrate motherboard can include: a substrate including a plurality of gate lines, gate driving leads, data lines, and date driving leads, wherein each gate line corresponds to one gate driving lead, and each data line corresponds to one data driving lead; a plurality of gate line testing leads, wherein each gate line testing lead is connected with a corresponding gate driving lead; a plurality of data line testing leads, wherein each data line testing lead is connected with a corresponding subset of the plurality of data driving leads; a plurality of gate line testing pads, wherein each gate line testing pad is connected with a corresponding gate line testing lead; a plurality of data line testing pads, wherein each data line testing pad is connected with two corresponding data line testing leads; wherein a width of each gate line testing pad is larger than a width of each gate line testing lead, and a width of the data line testing pad is larger than a width of the data line testing lead.

In some embodiments, the array substrate motherboard further include: at least one dummy gate line testing pad that is temperately disconnected with the gate line testing leads; at least one dummy data line testing pad that is temperately disconnected with the data line testing leads; at least one common testing pad to connect at least one adjacent common electrode driving lead; and an insulating layer between the data line testing pads and the data line driving leads; wherein: a total number of the gate line testing pads and dummy gate line testing pads is equal to or larger than 20, the gate line testing pads and the dummy gate line testing pads are arranged along a straight line on one side of the gate line driving leads, the gate line testing pads and the dummy gate line testing pads are equally spaced, and the gate line testing pads, the at least one dummy gate line testing pad, the gate line testing leads, and the gate line driving leads are made of a same material and are in a same layer; a total number of the data line testing pads, the at least one dummy data line testing pad, and the at least one common testing pad is equal to or larger than 20, the data line testing pads, the at least one dummy data line testing pad, and the at least one common testing pad are arranged along a straight line on one side of the data line driving leads, the data line testing pads, the at least one dummy data line testing pad, and the at least one common testing pad are equally spaced, and each data line driving lead is connected with two data line testing leads that penetrate through the insulating layer through two via-holes respectively, and the two data line testing leads are connected to a same data line testing pad.

In some embodiments, a number of the data line testing pads is two; a first data line testing pad is interconnected with all odd number data line driving leads through two data line testing leads; and a second data line testing pad is interconnected with all odd number data line driving leads through two data line testing leads.

In some embodiments, a number of the data line testing pads is six; a first data line testing pad is interconnected with a subset of data line driving leads carrying a R1 signal through two data line testing leads; a second data line testing pad is interconnected with a subset of data line driving leads carrying a G1 signal through two data line testing leads; a third data line testing pad is interconnected with a subset of data line driving leads carrying a B1 signal through two data line testing leads; a fourth data line testing pad is interconnected with a subset of data line driving leads carrying a R2 signal through two data line testing leads; a fifth data line testing pad is interconnected with a subset of data line driving leads carrying a G2 signal through two data line testing leads; and a sixth data line testing pad is interconnected with a subset of data line driving leads carrying a B2 signal through two data line testing leads.

In some embodiments, at least a pair of laser alignment marks configured for aligning a laser in a trimming region of the substrate to trim a portion of the gate line testing leads and the data line testing leads after testing the gate lines and the of data lines; and a plurality of gate line testing extension lines bypasses the trimming region, wherein one end of each the gate line testing extension lines is connected to a corresponding gate line testing pad, another end of each gate line testing extension lines is extended towards an edge of the substrate.

Another aspect of the present disclosure provides a display panel motherboard including an array substrate motherboard as described above.

Other aspects of the present disclosure can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides an array substrate motherboard, a fabricating method thereof, and a related display panel motherboard. The disclosed array substrate motherboard may include multiple gate lines and multiple gate line driving leads connected with the gate lines. A non-display region of the array substrate motherboard may include multiple gate line testing leads and multiple gate line testing pads. For each gate line testing lead, one end is connected with a corresponding gate line testing pad, the other end is connected with a corresponding gate driving lead. The gate line testing pads, the gate line testing leads, and the gate line driving leads are made of a same material, and are located in a same layer.

In the disclosed array substrate motherboard, the gate line testing leads and the gate line driving leads are made of a same material and are formed in a same layer. Thus the gate line testing leads and the gate line driving leads can be connected without going through via holes. Therefore, the disclosed array substrate motherboard can avoid the electro-static discharge problem caused by the via holes when the gate lines are used for testing. The subsequent results of the electro-static discharge, such as gate lines being broken down, abnormal lighting, bright lines, etc., can be effectively eliminated.

Figure 1:
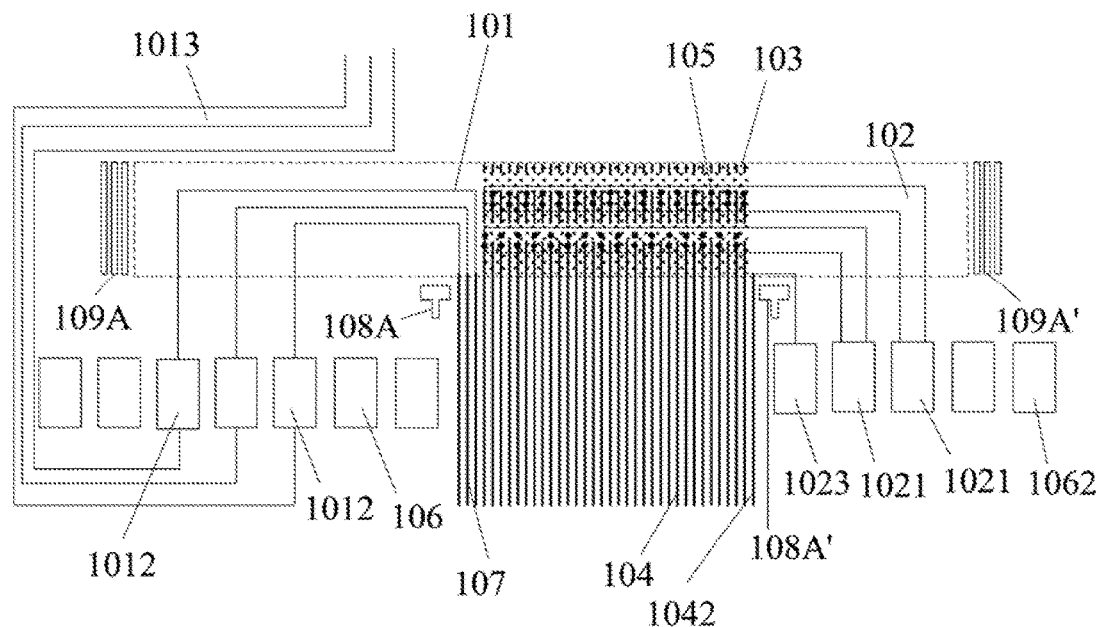
FIG. 1 is a schematic diagram of an testing circuit arrangement of an exemplary array substrate motherboard in accordance with some embodiments of the disclosed subject matter.

Referring to FIG. 1, a schematic diagram of an testing circuit arrangement of an exemplary array substrate motherboard is shown in accordance with some embodiments of the disclosed subject matter.

As illustrated, the disclosed array substrate motherboard includes multiple gate lines and multiple gate line driving leads 107 connected with the gate lines. A non-display region of the array substrate motherboard may include multiple gate line testing leads 101 and multiple gate line testing pads 1012. For each gate line testing lead 101, one end is connected with a corresponding gate line testing pad 1012, the other end is connected with a corresponding gate driving lead 107. The gate line testing pads 1012, the gate line testing leads 101, and the gate line driving leads 107 are made of a same material, and are located in a same layer.

In some embodiments, since the gate line testing leads and the gate line driving leads are made of a same material and are located in a same layer, the gate line testing leads and the gate line driving leads can be connected without going through via holes. Accordingly, the disclosed array substrate motherboard can avoid the electro-static discharge problem caused by the via holes when the gate lines are used for testing. Therefore, the subsequent results of the electro-static discharge, such as gate lines being broken down, abnormal lighting, bright lines, etc., can be effectively eliminated.

The array substrate motherboard can be a large glass substrate which multiple array substrates are formed on. Each array substrate can be fabricated to form a display ultimately.

In some embodiments, the gate line testing leads 101 and the gate line testing pads 1012 are formed in a same layer.

In some embodiments, as illustrated in FIG. 1, a width of each gate line testing pad 1012 is larger than a width of each gate line testing lead 101.

Generally, in an array substrate motherboard, a distance between adjacent block pins may be 38 um-40 um, and a distance between adjacent leads may be 38 um-40 um. Since the lead pitch is extremely small, when the block pins are contacting the leads, some displacement and scratches may easy occur. As such, if there are high current signals (e.g., clock signals) going through, the array substrate motherboard may be broken down. Additionally, the block pins may be easily damaged due to its very small size, resulting a high equipment maintenance cost.

In some embodiments of the disclosed array substrate motherboard, since the width of each gate line testing pad 1012 is larger than the width of each gate line testing lead 101, the effective contacting area between each block pin and each gate line testing pad is increased. Therefore, when the block pins are in contact with the gate line testing pads, the requirement of a contacting accuracy can be reduced. Even if there is some offset of a block pin, the block pin can still being in contact with a corresponding gate line testing pad. At the same time, since the width of each gate test electrode is large, each gate electrode can have a low resistance, which can endure a large current without being easily broken down or damaged.

As illustrated in FIG. 1, the array substrate motherboard can further include one or more dummy gate line testing pads 106. The one or more dummy gate line testing pads 106 are disconnected from the gate line testing leads 101. By using the one or more dummy gate line testing pads 106, the array substrate can be applied to various motherboard test devices with different specifications and configurations.

In some embodiments, a total number of the gate line testing pads 1012 plus the dummy gate line testing pads 106 is equal or larger than 20. The gate line testing pads 1012 plus the dummy gate line testing pads 106 can be arranged along a straight line on one side of the gate line driving leads 107, as shown in FIG. 1. The spaces between adjacent gate line testing pads 1012 and/or the dummy gate line testing pads 106 are equal.

In some embodiments, the gate line driving leads are extension lines of the gate lines extending to the non-display region.

In a subsequent process, the gate line testing leads 101 can be trimmed. Then one or more driving circuits can be connected to the driving leads, so that the testing leads will not affect the normal use of a display product comprising the array substrate. Meanwhile, the gate line driving leads can be used as the input lines of the driving signals.

As illustrated in FIG. 1, the array substrate motherboard can further include at a pair of laser alignment marks 109A and 109A'. The laser alignment marks 109A and 109A' can be used to align a laser light to a trimming region (e.g., the region in dashed box) of the array substrate in a subsequently process to trim the gate line testing leads 101.

In some embodiments, the laser alignment marks 109A and 109A' are arranged in pairs on both sides of the trimming region of the array substrate master, as shown in the dashed box of FIG. 1. In some embodiments, a pair of T marks 108A and 108A' can be used to define a bottom line of the trimming region. Other configurations of the laser alignment marks can be placed in accordance with specific designs of an array substrate motherboard for trimming gate and/or data driving leads As illustrated in FIG. 1, the array substrate motherboard can further include multiple first gate line testing extension lines 1013. One end of each first gate line testing extension line 1013 is connected with a corresponding gate line testing pad 1012, another end of each first gate line testing extension line 1013 is extended to an edge of the array substrate motherboard.

In order to improve the success rate of the contact between the testing block pins and the gate line testing pads, a width of the gate line testing pads may be larger than a first predetermined value. In some embodiments, the first predetermined value can be 30 µm. A maximum width of the gate line testing pads can be determined depending on the size of the array substrate.

In some embodiments, the array substrate motherboard can further include multiple data lines. The non-display region of the array substrate motherboard cam also include multiple data line testing leads 102, multiple data line driving leads 104, and multiple data line testing pads 1021.

One end of each data line testing lead 102 is connected to a corresponding data line driving lead 104, and another end is connected to a corresponding data line testing pad 1021. One end of each data line driving lead 104 is connected with a corresponding data line testing lead 102, and another end is connected to a corresponding data line.

In some embodiments, the multiple data line testing leads 102 and multiple data line testing pads 1021 are made by a same material.

Figure 2A:
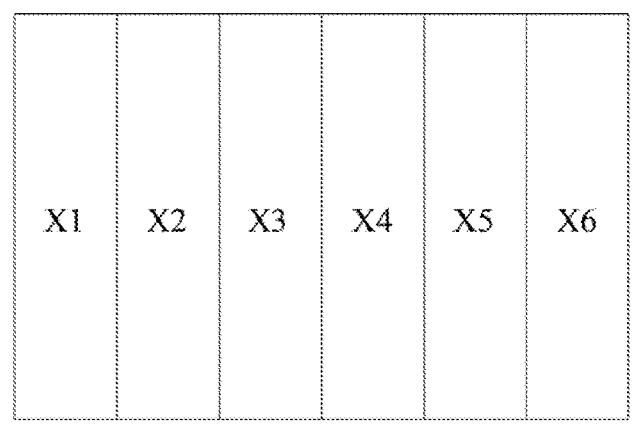
FIG. 2A is a schematic diagram of a partition of an exemplary array substrate motherboard including X1-X6 regions in accordance with some embodiments of the disclosed subject matter.
Figure 2B:
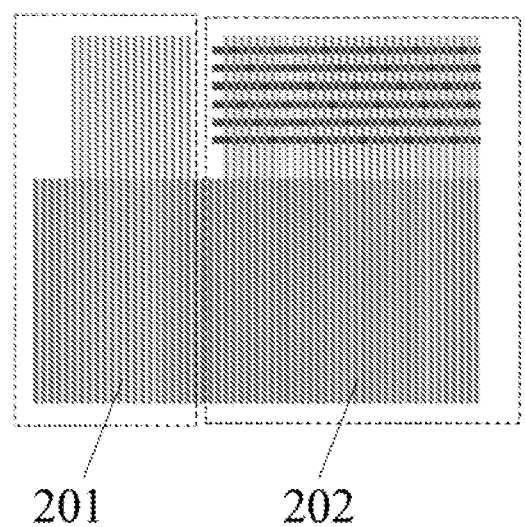
FIG. 2B is a schematic diagram of an exemplary arrangement of a signal line area and a gate driver on array (GOA) area in the X1 region shown in FIG. 2A in accordance with some embodiments of the disclosed subject matter.
Figure 2C:
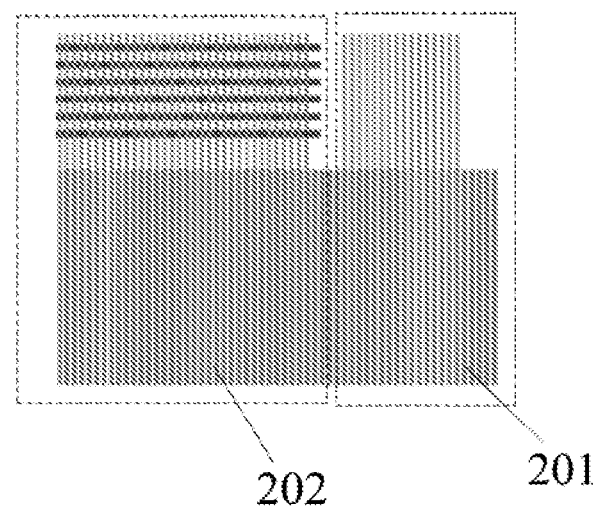
FIG. 2C is a schematic diagram of an exemplary arrangement of a signal line area and a gate driver on array (GOA) area in the X6 region shown in FIG. 2A in accordance with some embodiments of the disclosed subject matter.
Figure 2D:
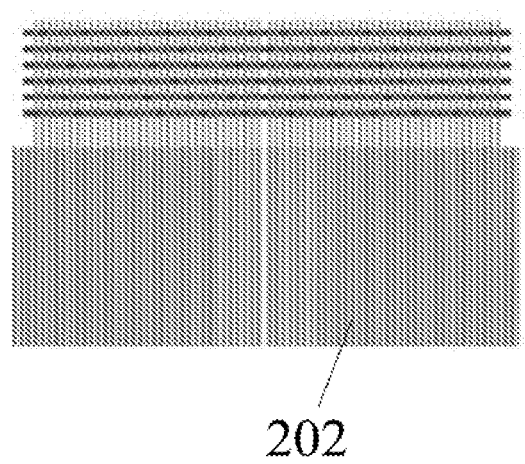
FIG. 2D is a schematic diagram of an exemplary arrangement of a signal line area in the X2-X5 regions shown in FIG. 2A in accordance with some embodiments of the disclosed subject matter.

Turning to FIG. 2A-2D, schematic diagrams of a partition of an exemplary array substrate motherboard including X1-X6 regions are shown in accordance with some embodiments of the disclosed subject matter. FIG. 2B is a schematic diagram of an exemplary arrangement of a signal line area and a gate driver on array (GOA) area in the X1 region shown in FIG. 2A; FIG. 2C is a schematic diagram of an exemplary arrangement of a signal line area and a gate driver on array (GOA) area in the X6 region shown in FIG. 2A; and FIG. 2D is a schematic diagram of an exemplary arrangement of a signal line area in the X2-X5 regions shown in FIG. 2A.

By using the gate driver on array (GOA) technique, the gate driver IC can be omitted, and no additional process step is needed. Since the production costs can be reduced, the gate driver on array (GOA) technique is widely used in the industry.

Currently, when a cell test is performed for a GOA product, the GOA unit timing signals can include: clock signals (CLK1, CLK2, CLK3, CLK4), start vertical signal (STV), voltage series signal (VSS), etc. These timing signals can by introduced from the lead region by using a full contact lighting method.

The GOA signals are inputted from the only positions at the very first panel pad and the very last panel pad. As illustrated in FIGS. 2B and 2C, the X1 region and the X6 region of the array substrate motherboard include gate driver on array (GOA) areas 201 and data line areas 202. As illustrated in FIG. 2D, the X2-X5 regions of the array substrate motherboard only include data line areas 202.

Figure 3:
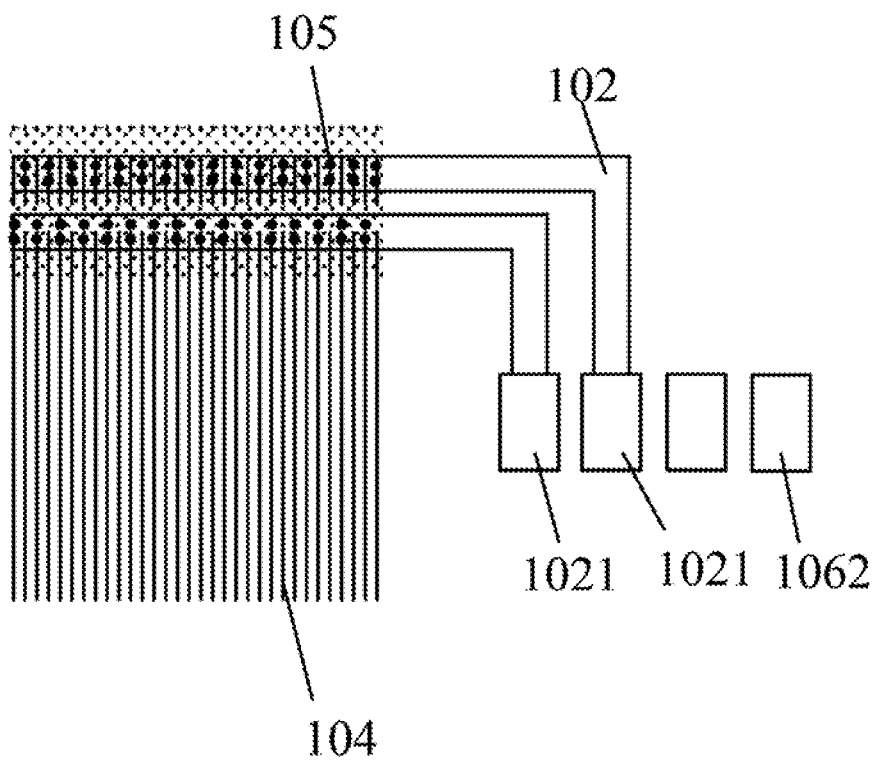
FIG. 3 is a schematic diagram of an exemplary arrangement of testing lines in a non-GOA area of an array substrate motherboard in accordance with some embodiments of the disclosed subject matter.

Referring to FIG. 3, a schematic diagram of an exemplary arrangement of testing lines in a non-GOA area of an array substrate motherboard is shown in accordance with some embodiments of the disclosed subject matter.

For a GOA product, the input signals from the leads can include GOA signals, and data signals such as Red Green Blue (RGB) signals. In some embodiments, the X2-X5 regions of the array substrate motherboard do not need to be connected to gate leads or gate line testing pads. As illustrated in FIG. 3, data line testing pads 1021, data line testing leads 102, and data line driving leads 104 can be configured in the data line area. In a particular example, the data line testing pads 1021 can be arranged on both sides of the data line driving leads 104 for certain practical needs.

In some embodiments, the gate line driving leads are extension lines of the gate lines extending to the non-display region.

In a subsequent process, the data line testing leads 102 can be trimmed. Then one or more driving circuits can be connected to the driving leads, so that the testing leads will not affect the normal use of a display product comprising the array substrate. Meanwhile, the data line driving leads can be used as the input lines of the driving signals.

Referring back to FIG. 1, the trimming region (e.g., the region in dashed box) of the array substrate can include both of the gate line testing leads 101 and the data line testing leads 102. The pair of first laser alignment marks 109A and 109A' can be arranged on both sides of the trimming region to align a laser light to the trimming region in a subsequently process to trim the gate line testing leads 101 and the data line testing leads 102.

As illustrated in FIG. 1, in some embodiments, a width of the data line testing pads 1021 may be larger than a width of the data line testing leads 102.

In some embodiments, the array substrate motherboard can further include one or more dummy data line testing pads 1062. The one or more dummy data line testing pads 1062 are disconnected with the data line testing leads 102.

In some embodiments, each data line testing lead 102 is connected with a corresponding data line testing pad 1021. Each data line driving lead 104 is connected with a corresponding data line.

Assuming that a total number of the data line testing leads 102 is N, and N is either an even number or an odd multiples of three. The first data line testing lead 102 can be connected with multiple data line driving leads 104 with the order numbers of 1, N+1, 2N+1, . . . ; the second data line testing lead 102 can be connected with multiple data line driving leads 104 with the order numbers of 2, N+2, 2N+2 . . . ; so on and so forth; the Nth data line testing lead 102 can be connected with multiple data line driving leads 104 with the order numbers of N, 2N, 3N . . . .

In a detection process, the odd-numbered data lines and the even-numbered data lines are separated to apply positive load voltage signals and negative load voltage signals respectively. Therefore, N is chosen either as an even number or an odd multiples of three in order to accommodate the detection and testing process.

For example, two data line testing pads can be provided in one embodiment. One data line testing pad can be connected with the data line driving leads of odd numbers. The other data line testing pad can be connected with the data line driving leads of even numbers.

When the test signals are RGB signals, a number of the date line testing electrodes can be a multiple of number six.

For example, six data line testing pads can be provided. The first data line testing pad can be connected with the number 6N+1 data line driving leads carrying the R1 signals; the second data line testing pad can be connected with the number 6N+2 data line driving leads carrying G1 signals; the third data line testing pad can be connected with the number 6N+3 data line driving leads carrying the B1 signals; the fourth data line testing pad can be connected with the number 6N+4 data line driving leads carrying the R2 signals; the fifth data line testing pad can be connected with the number 6N+5 data line driving leads carrying G2 signals; the sixth data line testing pad can be connected with the number 6N+6 data line driving leads carrying the B2 signals.

In certain testing processes, the testing signals can be send to the odd-numbered data lines and the even-numbered data lines respectively. In the embodiment that two data line testing pads are provided, the multiple data lines and the corresponding multiple data line driving lines can be numbered. The odd-numbered data lines can be connected to one data line testing pad, and the even-numbered data lines can be connected to the other data line testing pad.

Since the number of the data line testing pads can be reduced, the data line testing pads can be configured in the non-display region or the non-lead region. Therefore, the width of the testing electrodes can be increased. This design can reduce the number of testing leads, improve the contacting stability, increase the distances between the testing electrodes, and reducing the contacting failure possibility between the testing block pins and the data line testing pads.

In some embodiments of the disclosed array substrate motherboard, the widths of the data line testing leads and the data line testing pads are wide, so that the data line testing leads and the data line testing pads can have low resistance. Therefore, the signal attenuation can be reduced, and the gray-scale difference caused by the signal attenuation can be also reduced.

Further, in some embodiments of the disclosed array substrate motherboard, the testing signals can be introduced from the periphery of the array substrate. This design can provide large-sized separate signal testing electrodes. Therefore, the disadvantages of the existing array substrate motherboard, that the small size of the block pins that may cause poor contacting and cause the leads and the testing electrodes to be easily broken down, can be improved or eliminated.

Additionally, in some embodiments of the disclosed array substrate motherboard, the testing block pins can be avoided to be directly in contact with the lead region of the array substrate motherboard. Therefore, the lead region may suffer no damages caused by the direct contacting by the testing block pins.

In some embodiments of the disclosed array substrate motherboard, by using large-sized testing signal electrodes, the difficulty of using lighting method to debug can be reduced. Thereby, the downtime of the testing process can also be reduced.

Further, multiple data line driving leads can be connected to a single data line testing pad. This design can reduce the foot print of the non-display region on the array substrate occupied by the circuits, thereby improve the efficiency of the data line testing pads.

Each data line is connected with a corresponding data line driving lead. Using two or more via holes, each data line driving lead can be connected to a corresponding data line testing lead. If one via hole is broken down or disabled, the data line driving lead can be connected to the corresponding data line testing lead through another via hole. Therefore, the testing reliability can be improved.

Referring back to FIG. 1, in some embodiments, an insulating layer 103 can be provided between the data line testing leads 102 and the data line driving leads 104. A width of the data line testing leads 102 is larger than a width of the data line driving leads 104. The data line testing leads 102 can be positioned above the data line driving leads 104. Using two or more via holes, each data line driving lead can be connected to a corresponding data line testing lead.

In some embodiments, the data line driving leads 104 are extension lines of the data lines that are extended to the non-display region.

In some embodiments, when the array substrate motherboard includes gate line driving leads and data line driving leads, the gate line driving leads and the data line driving leads are parallel to each other.

During the testing process, in order to improve the success rate of the contact between the testing block pins and the data line testing pads, a width of the data line testing pads is set to be larger than a first predetermined value to avoid contact omissions. In one embodiment, the first predetermined value may be 30 µm. A maximum width of the data line testing pads can be determined depending on the size of the array substrate.

In some embodiments, as illustrated in FIG. 1, one or more common testing pads 1023 can be provided between the data line testing pads 1021 and the data line driving leads 104. The one or more common testing pads 1023 can be connected to adjacent common electrode driving leads 1042.

In some embodiments, a total number of the data line testing pads 1021, the common testing pads 1023, and the dummy data line testing pads 1062 is equal or larger than 20. The data line testing pads 1021, the common testing pads 1023, and the dummy data line testing pads 1062 can be arranged along a straight line on one side of the data line driving leads 104, as shown in FIG. 1. The spaces between adjacent data line testing pads 1021, the common testing pads 1023, and/or the dummy data line testing pads 1062 are equal.

In some embodiments, a distance between adjacent gate line testing pads is greater than a second predetermined value. Specifically, the distance between adjacent gate line testing pads can be increased through a designed circuit layout.

The first predetermined value and/or the second predetermined value can ensure that the signal line testing electrodes be in contact with the block pins without contact omissions, and can be determined by specific experiments.

Accordingly, in the disclosed array substrate motherboard, the gate line testing leads and the gate line driving leads are made of a same material and are located in a same layer. Thus the gate line testing leads and the gate line driving leads can be connected without going through via holes. Therefore, the disclosed array substrate motherboard can avoid the electro-static discharge problem caused by the via holes when the gate lines are used during testing. The subsequent results of the electro-static discharge, such as gate lines being broken down, abnormal lighting, bright lines, etc., can be effectively eliminated.

Another aspect of the disclosed subject matter provides a display panel motherboard, including any of the disclosed array substrate motherboard. The display panel may be any product or component that has a display function, such as an LCD, an electronic paper, an OLED panel, etc.

It should be noted that, the display panel motherboard includes multiple display panels. Each display panel may be implemented individually to perform a display function. The display panel motherboard can be cut into multiple display panels by using a cutting process.

In summary, an array substrate motherboard and a fabricating method thereof are provided. The method for fabricating an array substrate motherboard can include: providing a substrate including a plurality of gate lines, gate driving leads, data lines, and data driving leads, wherein each gate line corresponds to one gate driving lead, and each data line corresponds to one data driving lead; forming a plurality of gate line testing leads, wherein each gate line testing lead is connected with a corresponding gate driving lead; forming a plurality of data line testing leads, wherein each data line testing lead is connected with a corresponding subset of the plurality of data driving leads; forming a plurality of gate line testing pads, wherein each gate line testing pad is connected with a corresponding gate line testing lead; forming a plurality of data line testing pads, wherein each data line testing pad is connected with two corresponding data line testing leads; and using the plurality of gate line testing pads and the plurality of gate line testing pads to test the plurality of gate lines and the plurality of data lines.

In some embodiments, a width of each gate line testing pad is larger than a width of each gate line testing lead; and a width of the data line testing pad is larger than a width of the data line testing lead.

In some embodiments, the method further comprises: forming at least one dummy gate line testing pad that is temperately disconnected with the gate line testing leads.

In some embodiments, a total number of the gate line testing pads and dummy gate line testing pads is equal to or larger than 20.

In some embodiments, the gate line testing pads and the dummy gate line testing pads are arranged along a straight line on one side of the gate line driving leads; and the gate line testing pads and the dummy gate line testing pads are equally spaced.

In some embodiments, the gate line testing pads, the at least one dummy gate line testing pad, the gate line testing leads, and the gate line driving leads are made of a same material, and are in a same layer.

In some embodiments, the method further comprises: forming at least one dummy data line testing pad that is temperately disconnected with the data line testing leads.

In some embodiments, the method further comprises: forming at least one common testing pad to connect at least one adjacent common electrode driving lead.

In some embodiments, a total number of the data line testing pads, the at least one dummy data line testing pad, and the at least one common testing pad is equal to or larger than 20.

In some embodiments, the method further comprises: the data line testing pads, the at least one dummy data line testing pad, and the at least one common testing pad are arranged along a straight line on one side of the data line driving leads; and the data line testing pads, the at least one dummy data line testing pad, and the at least one common testing pad are equally spaced.

In some embodiments, the method further comprises: forming an insulating layer between the data line testing pads and the data line driving leads; wherein each data line driving lead is connected with two data line testing leads that penetrate through the insulating layer through two via-holes respectively, and the two data line testing leads are connected to a same data line testing pad.

In some embodiments, a number of the data line testing pads is two; a first data line testing pad is interconnected with all odd number data line driving leads through two data line testing leads; and a second data line testing pad is interconnected with all odd number data line driving leads through two data line testing leads.

In some embodiments, a number of the data line testing pads is six; a first data line testing pad is interconnected with a subset of data line driving leads carrying a R1 signal through two data line testing leads; a second data line testing pad is interconnected with a subset of data line driving leads carrying a G1 signal through two data line testing leads; a third data line testing pad is interconnected with a subset of data line driving leads carrying a B1 signal through two data line testing leads; a fourth data line testing pad is interconnected with a subset of data line driving leads carrying a R2 signal through two data line testing leads; a fifth data line testing pad is interconnected with a subset of data line driving leads carrying a G2 signal through two data line testing leads; and a sixth data line testing pad is interconnected with a subset of data line driving leads carrying a B2 signal through two data line testing leads.

In some embodiments, the method further comprises: forming at least a pair of laser alignment marks to align a laser in a trimming region of the substrate, wherein the trimming region of the substrate includes a portion of the gate line testing leads and the data line testing leads; and after testing the gate lines and the of data lines, emitting a laser in the trimming region to trim the portion of the gate line testing leads and the data line testing leads.

In some embodiments, the method further comprises: forming a plurality of gate line testing extension lines bypasses the trimming region, wherein one end of each the gate line testing extension lines is connected to a corresponding gate line testing pad, another end of each gate line testing extension lines is extended towards an edge of the substrate.

Similarly, an array substrate motherboard is provided accordingly. The array substrate motherboard can include: a substrate including a plurality of gate lines, gate driving leads, data lines, and date driving leads, wherein each gate line corresponds to one gate driving lead, and each data line corresponds to one data driving lead; a plurality of gate line testing leads, wherein each gate line testing lead is connected with a corresponding gate driving lead; a plurality of data line testing leads, wherein each data line testing lead is connected with a corresponding subset of the plurality of data driving leads; a plurality of gate line testing pads, wherein each gate line testing pad is connected with a corresponding gate line testing lead; a plurality of data line testing pads, wherein each data line testing pad is connected with two corresponding data line testing leads; wherein a width of each gate line testing pad is larger than a width of each gate line testing lead, and a width of the data line testing pad is larger than a width of the data line testing lead.

In some embodiments, the array substrate motherboard further include: at least one dummy gate line testing pad that is temperately disconnected with the gate line testing leads; at least one dummy data line testing pad that is temperately disconnected with the data line testing leads; at least one common testing pad to connect at least one adjacent common electrode driving lead; and an insulating layer between the data line testing pads and the data line driving leads; wherein: a total number of the gate line testing pads and dummy gate line testing pads is equal to or larger than 20, the gate line testing pads and the dummy gate line testing pads are arranged along a straight line on one side of the gate line driving leads, the gate line testing pads and the dummy gate line testing pads are equally spaced, and the gate line testing pads, the at least one dummy gate line testing pad, the gate line testing leads, and the gate line driving leads are made of a same material and are in a same layer; a total number of the data line testing pads, the at least one dummy data line testing pad, and the at least one common testing pad is equal to or larger than 20, the data line testing pads, the at least one dummy data line testing pad, and the at least one common testing pad are arranged along a straight line on one side of the data line driving leads, the data line testing pads, the at least one dummy data line testing pad, and the at least one common testing pad are equally spaced, and each data line driving lead is connected with two data line testing leads that penetrate through the insulating layer through two via-holes respectively, and the two data line testing leads are connected to a same data line testing pad.

In some embodiments, a number of the data line testing pads is two; a first data line testing pad is interconnected with all odd number data line driving leads through two data line testing leads; and a second data line testing pad is interconnected with all odd number data line driving leads through two data line testing leads.

In some embodiments, a number of the data line testing pads is six; a first data line testing pad is interconnected with a subset of data line driving leads carrying a R1 signal through two data line testing leads; a second data line testing pad is interconnected with a subset of data line driving leads carrying a G1 signal through two data line testing leads; a third data line testing pad is interconnected with a subset of data line driving leads carrying a B1 signal through two data line testing leads; a fourth data line testing pad is interconnected with a subset of data line driving leads carrying a R2 signal through two data line testing leads; a fifth data line testing pad is interconnected with a subset of data line driving leads carrying a G2 signal through two data line testing leads; and a sixth data line testing pad is interconnected with a subset of data line driving leads carrying a B2 signal through two data line testing leads.

In some embodiments, at least a pair of laser alignment marks configured for aligning a laser in a trimming region of the substrate to trim a portion of the gate line testing leads and the data line testing leads after testing the gate lines and the of data lines; and a plurality of gate line testing extension lines bypasses the trimming region, wherein one end of each the gate line testing extension lines is connected to a corresponding gate line testing pad, another end of each gate line testing extension lines is extended towards an edge of the substrate.

In the disclosed display panel motherboard, the gate line testing leads and the gate line driving leads are made of a same material and are located in a same layer. Thus the gate line testing leads and the gate line driving leads can be connected without going through via holes. Therefore, the disclosed display panel motherboard can avoid the electro-static discharge problem caused by the via holes when the gate lines are used during testing. The subsequent results of the electro-static discharge, such as gate lines being broken down, abnormal lighting, bright lines, etc., can be effectively eliminated.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A method for fabricating an array substrate motherboard, comprising:
providing a substrate including a plurality of gate lines, gate line driving leads, data lines, and data line driving leads, wherein each gate line corresponds to one gate line driving lead, and each data line corresponds to one data line driving lead;
forming a plurality of gate line testing leads, wherein each gate line testing lead is connected with a corresponding gate line driving lead;
forming a plurality of data line testing leads, wherein each data line testing lead is connected with a corresponding subset of the plurality of data line driving leads;
forming a plurality of gate line testing pads, wherein each gate line testing pad is connected with a corresponding gate line testing lead;
forming a plurality of data line testing pads, wherein each data line testing pad is connected with two corresponding data line testing leads, wherein:
a number of the data line testing pads is six,
a first data line testing pad is interconnected with a subset of data line driving leads carrying a first red signal through two data line testing leads,
a second data line testing pad is interconnected with a subset of data line driving leads carrying a first green signal through two data line testing leads,
a third data line testing pad is interconnected with a subset of data line driving leads carrying a first blue signal through two data line testing leads,
a fourth data line testing pad is interconnected with a subset of data line driving leads carrying a second red signal through two data line testing leads,
a fifth data line testing pad is interconnected with a subset of data line driving leads carrying a second green signal through two data line testing leads, and
a sixth data line testing pad is interconnected with a subset of data line driving leads carrying a second blue signal through two data line testing leads; and
using the plurality of gate line testing pads and the plurality of gate line testing pads to test the plurality of gate lines and the plurality of data lines.

2. The method of claim 1, wherein:
a width of each gate line testing pad is larger than a width of each gate line testing lead; and
a width of the data line testing pad is larger than a width of the data line testing lead.

3. The method of claim 1, further comprising:
forming at least one dummy gate line testing pad that is disconnected with the gate line testing leads.

4. The method of claim 3, wherein:
a total number of the gate line testing pads and dummy gate line testing pads is equal to or larger than 20.

5. The method of claim 4, wherein:
the gate line testing pads and the dummy gate line testing pads are arranged along a straight line on one side of the gate line driving leads; and
the gate line testing pads and the dummy gate line testing pads are equally spaced.

6. The method of claim 3, wherein:
the gate line testing pads, the at least one dummy gate line testing pad, the gate line testing leads, and the gate line driving leads are made of a same material, and are in a same layer.

7. The method of claim 1, further comprising:
forming at least one dummy data line testing pad that is disconnected with the data line testing leads.

8. The method of claim 7, further comprising:
forming at least one common testing pad to connect at least one adjacent common electrode driving lead.

9. The method of claim 8, wherein:
a total number of the data line testing pads, the at least one dummy data line testing pad, and the at least one common testing pad is equal to or larger than 20.

10. The method of claim 8, wherein:
the data line testing pads, the at least one dummy data line testing pad, and the at least one common testing pad are arranged along a straight line on one side of the data line driving leads; and
the data line testing pads, the at least one dummy data line testing pad, and the at least one common testing pad are equally spaced.

11. The method of claim 1, further comprising:
forming an insulating layer between the data line testing pads and the data line driving leads;
wherein each data line driving lead is connected with two data line testing leads that penetrate through the insulating layer through two via-holes respectively, and the two data line testing leads are connected to a same data line testing pad.

12. The method of claim 1, further comprising:
forming at least a pair of laser alignment marks to align a laser in a trimming region of the substrate, wherein the trimming region of the substrate includes a portion of the gate line testing leads and the data line testing leads; and
after testing the gate lines and the of data lines, emitting a laser in the trimming region to trim the portion of the gate line testing leads and the data line testing leads.

13. The method of claim 12, further comprising:
forming a plurality of gate line testing extension lines bypasses the trimming region, wherein one end of each the gate line testing extension lines is connected to a corresponding gate line testing pad, another end of each gate line testing extension lines is extended towards an edge of the substrate.

14. An array substrate motherboard, comprising:
a substrate including a plurality of gate lines, gate line driving leads, data lines, and data line driving leads, wherein each gate line corresponds to one gate line driving lead, and each data line corresponds to one data line driving lead;
a plurality of gate line testing leads, wherein each gate line testing lead is directly connected with a corresponding gate line driving lead in a trimming region;
a plurality of data line testing leads, wherein each data line testing lead is connected with a corresponding subset of the plurality of data line driving leads;
a plurality of gate line testing pads, wherein each gate line testing pad is connected with a corresponding gate line testing lead;
a plurality of data line testing pads, wherein each data line testing pad is connected with two corresponding data line testing leads; and
an insulating layer, arranged between the data line testing pads and the data line driving leads in the trimming region, wherein each data line driving lead is connected with two data line testing leads that penetrate through the insulating layer through two via-holes, respectively, and the trimming region includes a portion of the gate line testing leads and a portion of the data line testing leads, where a laser is applied to trim the portion of the gate line testing leads and the portion of the data line testing leads to separate the gate line testing leads and the data line testing leads from the corresponding gate line driving leads and the corresponding data line driving leads, respectively,
wherein a width of each gate line testing pad is larger than a width of each gate line testing lead, and a width of the data line testing pad is larger than a width of the data line testing lead.

15. The array substrate motherboard of claim 14, further comprising:
at least one dummy gate line testing pad that is disconnected with the gate line testing leads;
at least one dummy data line testing pad that is disconnected with the data line testing leads;
at least one common testing pad to connect at least one adjacent common electrode driving lead; and
an insulating layer between the data line testing pads and the data line driving leads;
wherein:
a total number of the gate line testing pads and dummy gate line testing pads is equal to or larger than 20, the gate line testing pads and the dummy gate line testing pads are arranged along a straight line on one side of the gate line driving leads, the gate line testing pads and the dummy gate line testing pads are equally spaced, and the gate line testing pads, the at least one dummy gate line testing pad, the gate line testing leads, and the gate line driving leads are made of a same material and are in a same layer; and
a total number of the data line testing pads, the at least one dummy data line testing pad, and the at least one common testing pad is equal to or larger than 20, the data line testing pads, the at least one dummy data line testing pad, and the at least one common testing pad are arranged along a straight line on one side of the data line driving leads, the data line testing pads, the at least one dummy data line testing pad, and the at least one common testing pad are equally spaced, and each data line driving lead is connected with two data line testing leads that penetrate through the insulating layer through two via-holes respectively, and the two data line testing leads are connected to a same data line testing pad.

16. The array substrate motherboard of claim 14, wherein:
a number of the data line testing pads is two;
a first data line testing pad is interconnected with all odd number data line driving leads through two data line testing leads; and
a second data line testing pad is interconnected with all odd number data line driving leads through two data line testing leads.

17. The array substrate motherboard of claim 14, wherein:
a number of the data line testing pads is six;
a first data line testing pad is interconnected with a subset of data line driving leads carrying a first red signal through two data line testing leads;
a second data line testing pad is interconnected with a subset of data line driving leads carrying a first green signal through two data line testing leads;

a third data line testing pad is interconnected with a subset of data line driving leads carrying a first blue signal through two data line testing leads;

a fourth data line testing pad is interconnected with a subset of data line driving leads carrying a second red signal through two data line testing leads;

a fifth data line testing pad is interconnected with a subset of data line driving leads carrying a second green signal through two data line testing leads; and a sixth data line testing pad is interconnected with a subset of data line driving leads carrying a second blue signal through two data line testing leads.

18. The array substrate motherboard of claim 14, further comprising:

at least a pair of laser alignment marks configured for aligning the laser in the trimming region of the substrate; and a plurality of gate line testing extension lines bypasses the trimming region, wherein one end of each the gate line testing extension lines is connected to a corresponding gate line testing pad, another end of each gate line testing extension lines is extended towards an edge of the substrate.

* * * * *